United States Patent
Weerasinghe

(10) Patent No.: US 7,922,428 B2
(45) Date of Patent: Apr. 12, 2011

(54) COATED BORE CUTTING TOOLS

(75) Inventor: Vijitha Weerasinghe, London (GB)

(73) Assignee: Dormer Tools Limited, Sheffield (GB)

( * ) Notice: Subject to any disclaimer, the term of this patent is extended or adjusted under 35 U.S.C. 154(b) by 1034 days.

(21) Appl. No.: 10/569,962

(22) PCT Filed: Aug. 27, 2004

(86) PCT No.: PCT/GB2004/003649
§ 371 (c)(1),
(2), (4) Date: Sep. 12, 2006

(87) PCT Pub. No.: WO2005/021827
PCT Pub. Date: Mar. 10, 2005

(65) Prior Publication Data
US 2007/0160436 A1    Jul. 12, 2007

(30) Foreign Application Priority Data
Aug. 28, 2003   (GB) .................................. 0320148.0

(51) Int. Cl.
*B23B 51/02* (2006.01)
(52) U.S. Cl. ...................................... 408/144; 76/108.6
(58) Field of Classification Search ............... 408/57, 408/59, 144–145, 227–230; 76/108.1, 108.6; B23B 51/00, 51/02
See application file for complete search history.

(56) References Cited

U.S. PATENT DOCUMENTS

| | | | |
|---|---|---|---|
| 4,583,888 A * | 4/1986 | Mori et al. | 408/59 |
| 4,728,231 A * | 3/1988 | Kunimori et al. | 408/59 |
| 4,744,705 A | 5/1988 | Imanaga | |
| 5,137,398 A * | 8/1992 | Omori et al. | 408/145 |
| 6,315,504 B1 * | 11/2001 | Sekiguchi et al. | 408/144 |
| 6,866,889 B1 | 3/2005 | Lill et al. | |
| 6,923,602 B2 * | 8/2005 | Osawa et al. | 408/230 |

FOREIGN PATENT DOCUMENTS

| | | | |
|---|---|---|---|
| CH | 566183 A * | 9/1975 | |
| EP | 901860 A1 * | 3/1999 | |
| GB | 2 184 046 | 6/1987 | |
| GB | 2 259 263 | 3/1993 | |
| JP | 56003117 A * | 1/1981 | |
| JP | 56003118 | 1/1981 | |
| JP | 57 184616 | 11/1982 | |
| JP | 60114407 | 6/1985 | |
| JP | 01127232 A * | 5/1989 | |
| JP | 02311211 A * | 12/1990 | |
| JP | 3055104 | 3/1991 | |
| JP | 03 098709 | 4/1991 | |
| JP | 04275812 A * | 10/1992 | |
| JP | 07 060521 | 3/1995 | |
| JP | 7088713 | 4/1995 | |
| JP | 09011050 A * | 1/1997 | |
| JP | 10217015 A * | 8/1998 | |
| JP | 2000000712 | 1/2000 | |
| JP | 2000052119 A * | 2/2000 | |
| JP | 2001341021 A * | 12/2001 | |
| JP | 2003266224 | 9/2003 | |
| RU | 2131329 | 6/1999 | |

* cited by examiner

*Primary Examiner* — Daniel W Howell
(74) *Attorney, Agent, or Firm* — Stites & Harbison PLLC; Douglas E. Jackson

(57) ABSTRACT

A twist drill partially coated with TiN to increase wear resistance whilst minimising the transfer of coating particles to a work piece. The drill is selectively coated on the rake face (42); the land (46) is not coated.

26 Claims, 4 Drawing Sheets

80μm

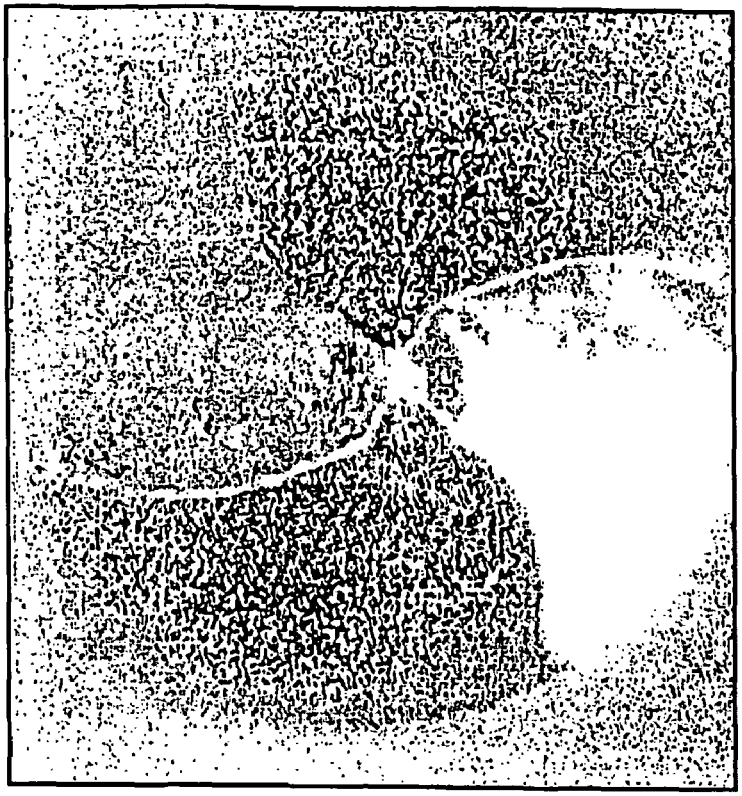
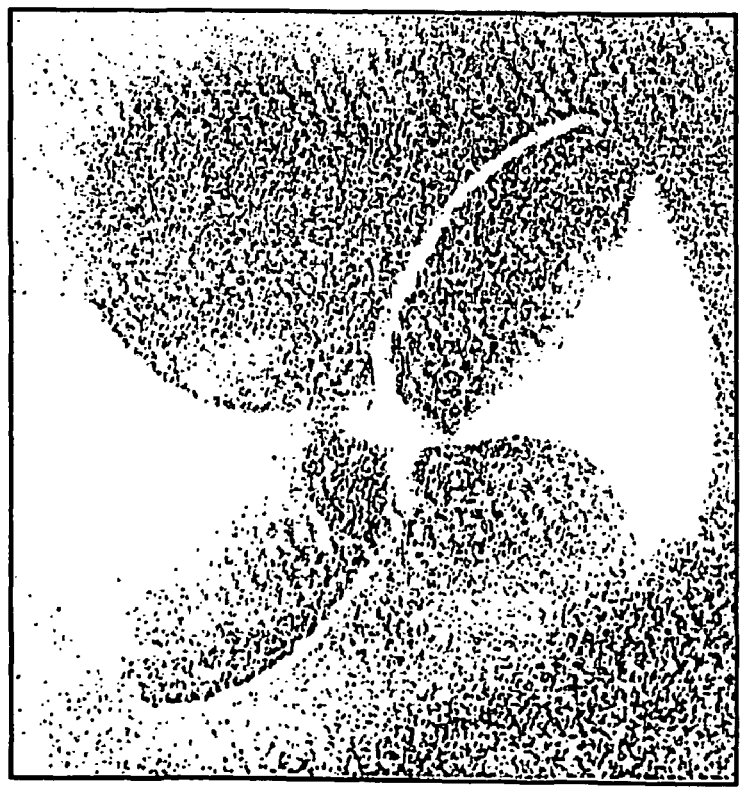
FIG. 7

COATED BORE CUTTING TOOLS

FIELD OF THE INVENTION

The present invention relates to coated bore cutting tools and methods of coating bore cutting tools, in particular coated drills having a wear resistant coating such at TiN to permit higher cutting speeds.

BACKGROUND TO THE INVENTION

It is known to apply a coating to bore (hole) cutting tools such as twist drills, reamers, core drills, countersinks, thread cutting tools, milling cutters etc. Drills (sometimes referred to as drill bits) in particular are coated to extend the life of the drill and to enhance cutting speed.

The materials used for coating generally have a higher hardness than the material from which the drill bit is made. For example, titanium nitride (TiN) coated tools have a surface hardness up to 3 times harder than uncoated high speed tools. The coating is also usually refractory and resistant to high temperatures.

The coatings are typically applied to the whole of the fluted end of the drill. FIG. 1 shows such a coated drill. The coating is normally applied by physical vapour deposition (PVD). TiN coated drills are easily recognised by their bright gold colour.

The coating thickness is typically about 1-4 μm. FIGS. 2 and 3 show a schematic of a typical high speed steel HSS drill, from the side and end-on respectively. The drill 10 has a shank 12 and body 14. The drill has length 16 which includes shank length 18 and body length 20. The body is fluted and includes two helical flutes 22. Separating the two flutes are two lands 24. The lands have a leading edge 26 and heel 28.

Extending from tip 30 are lips 32 (also known as cutting edges). The tip itself includes chisel edge 34. Rake face 36 extends rearwardly from lip (cutting edges) 32.

TiN coatings are applied to the entire body 14, so that tip 30, lands 24, flute 22, etc are all coated.

The chip is the name given to material that is cut away from the work piece that is being drilled. The chip is cut from the bottom of the hole by the chisel edge 34 and cutting lips 32 and is forced into the flutes 23 by contact with the rake face 36. Rotation of the flutes causes the chips to be evacuated from the hole.

As noted above, one of the most common coating materials is Titanim Nitride (TiN). TiN has high hardness, good resistance to high temperature and a low coefficient at friction. Consequently a TiN coating can improve the performance of and life-span of a drill. Cutting force measurements indicate a that TiN coating reduces the specific cutting energy by reducing friction at the drill-chip interface.

A particular advantage of TiN coated drills, especially TiN coated high-speed steel (HSS) drills is that they can be operated at high cutting speeds (e.g. 40%-50% higher than uncoated drills) and feed rates. Furthermore, they can be used to drill holes in hard, tough and abrasive materials.

HSS drills are highly alloyed steel and common types include either molybdenum or tungsten components together with chromium, vanadium and cobalt.

A widespread use for TiN coated high speed drills (HSS-TiN) is to drill holes in titanium and titanium alloys. These materials are used, e.g. in the aerospace industry because of their good mechanical properties. For the same reasons it is difficult to drill into titanium and its alloys.

Whilst HSS-TiN drills are routinely used to drill into titanium in many industries, they have not been adopted by the aerospace industry because there is concern that TiN particles from the coated drill could transfer to the work piece during drilling. Specifically, there is concern that under drilling conditions (high temperature and high friction) particles of TiN could become impregnated in the walls of the hole being drilled and that these particles could later be detrimental to the structural properties of the work piece, for example causing cracks.

Whilst the mechanism by which small particles of TiN might weaken titanium or titanium alloy work pieces is not known, it is thought that the particles could act as stress raisers or propagate failure fractures.

Even particles as small as 2 μm may affect the performance of the work piece.

Despite the concerns of the aerospace industry, there have been no published studies that prove that TiN particles are transferred to the work piece.

SUMMARY OF INVENTION

The present inventor has found that TiN particles do indeed transfer from TiN coated drills to work pieces.

A TiN coated drill was used to drill holes in a titanium alloy (TiAl6V4). Ten holes were drilled and a slitting machine used to cut the holes in half so as to observe the inner surfaces. The inner surfaces of the holes were analysed using a scanning electron microscope (SEM).

SEM observations showed particles of TiN (identified by virtue of the presence of nitrogen) embedded on the surface of a drilled hole. The particle size was about 10 μm, as shown in FIG. 4.

This established for the first time that transfer of TiN particles occurs.

The present invention seeks to address the drawbacks associated with existing coated bore cutting tools, in particular drills, especially TiN coated drills.

At its most general, the present invention proposes that effective cutting performance and good wear resistance can be achieved by coating the rake face of a bore cutting tool only. There is no need to coat the non-cutting surfaces, especially the lands. Partial coating of the bore cutting tool can provide the same advantages as coating the entire bore cutting tool.

In a first aspect, the present invention provides a bore (hole) cutting tool having a cutting edge, a rake face extending from one side of the cutting edge, and a non-cutting surface, wherein the rake face is at least partially coated but at least part of the non-cutting surface is not coated.

Preferably the bore cutting tool is coated on the rake face only.

The term bore cutting tool as used herein means a cutting tool for making a bore (or hole) in a work piece or machining the bore once it has been formed. Examples of such tools include twist drills, reamers, core drills, slot drills and counter sinks and the like.

Generally any cutting tool that has a cutting edge will have a rake face that leads the cutting edge (i.e. moves over the substrate to be cut in advance of the cutting edge). By way of example, cutting edges 100 on a twist drill are shown in FIG. 5. Rake face 42 extends from one of the cutting edges and in use (when the drill is rotating) the rake face moves in advance of the cutting edge.

Such a cutting tool will also have non-cutting surfaces, for example the lands 46 of a twist drill as shown in FIG. 5, or the flutes 48 on FIG. 5.

The cutting tools will also have a back face or flank extending from the cutting edge on the opposite side of the cutting edge to the rake face. The back face trails the cutting edge in use. By way of example, FIG. 5 shows a rake face 102 on a twist drill.

The present inventor has found that partial or complete coating of the rake face provides the same advantages of coating the whole cutting tool; the non-cutting surfaces and/or the back face do not need to be coated.

Preferably the bore cutting tool is a drill, more preferably a twist drill.

Optional and preferred features will now be described in relation to a drill, in particular a twist drill, but they can also apply to other bore cutting tools.

The rake face of a drill is subject to considerable wear during use and wear scars can develop, usually parallel to the cutting lip. The present inventor has found that good wear resistance can be achieved by coating the rake face and that coating other parts of the body does not necessarily bring about significant additional improvements in wear resistance.

Thus, at least part of the land can remain uncoated. Preferably all of the land or lands are uncoated. Similarly, it is preferred that at least part of the flutes are uncoated. Preferably all of the flute or flutes are uncoated.

Suitably, the coating on the rake face extends to the cutting lip.

The rake face of a drill is shown as feature 36 in FIG. 2. If coating particles become detached from the rake face, they should be removed from the work piece along with the "chip" that has been cut from the work piece, rather than become impregnated in the walls of the hole.

Where there is more than one flute, it is preferred that there is a coating on the rake face of each flute. The drill may include 2, 3 or 4 flutes. In a particularly preferred embodiment there are two flutes and a coating on the rake face of both flutes.

The present inventor has noted that the rake face is subject to a high degree of wear. This is because it is on one side of the cutting lip and is the surface that cuts into material from the work piece. The chip being cut from the work piece makes contact with the rake face before being evacuated up the flute. This is why wear scars are formed. The rake face reaches high temperatures because of the large amount of friction generated as the drill rotates and chips against the surface. The chip can still be attached to the work piece as it moves over the rake face—it is this action which lifts the chip from the bottom of the hole.

Suitably, the coating is a wear resistant coating. Preferably, it has a low coefficient of friction, e.g. lower than the coefficient of friction of the uncoated drill. Preferably it is refractory and resistant to high temperatures, suitably with a melting temperature of at least 1000° C. preferably at least 1500° C., better still at least 2000° C. Preferably it is resistant to oxidation in air, suitably at temperatures below 500° C., preferably below 600° C., more preferably below 700° C. It is preferred that the coating has a hardness of at least 1000 kg/Mm$^2$. Knoop or Vickers microhardness, more preferably at least 1500 kg/mm$^2$ and most preferably 2000 kg/mm$^2$.

Preferably the coating is unreactive towards one or more of acids, bases and solvents. Preferably it is inert to both acids and bases.

Suitable coatings include (but are not limited to) TiN, YiAlN, TiCN, TiAlN and AlTiN.

The drill itself can be made from known materials such as HSS, HSCo, HSCoXP and solid carbide. Preferably the drill is a twist drill.

The coating may comprise a single layer or multiple layers.

The coating thickness can be in the range 0.5 to 50 µm, preferably 1 to 20 µm, more preferably 2 to 10 µm. A thickness of about 1 to 4 µm is particularly preferred.

The coating is preferably applied by physical vapour deposition (PVD). The PVD process may be selected from vacuum evaporation, sputter deposition and ion plating. An electron beam may be used to evaporate deposition material which can then be deposited on the drill surface.

Suitably, selective or partial coating is achieved by masking those parts of the drill, for example, the lands, where no coating is wanted. Coating preferably occurs whilst the mask is in place. The mask can then be removed after coating has been completed.

In some embodiments, particularly where the drill is to be used to drill through holes, the coating can also be applied to the drill tip or point.

There are several advantages in selectively or partially coating a drill. Firstly, there can be cost savings because less coating material is needed, e.g. it can be applied only to the end part of the drill body (with masks in place) rather than the whole body.

These savings can be made without necessarily reducing the performance or the wear resistance of the drill. The present inventor has found that a partially coated drill performs as well as a fully coated drill. The drill life, i.e. the number of holes that can be drilled before the drill becomes dull, is also comparable for partially and fully coated drills.

Secondly, by minimising the extent of coating, and preferably dispensing with a coating on all but the rake face, the problem of transfer of coating particles to the work piece is reduced. In particular, by keeping the lands free of coating the surface area of coating in contact with the walls of the holes in the work piece is considerably reduced.

Indeed, the present inventor has noted that the surfaces of the drill which come into contact with the work piece but do not cut into the work piece may be responsible for a significant amount of the particles being transferred to the work piece. In particular, the lands that are in contact with the walls of the hole, may be responsible for a significant number of the particles.

In a second aspect, the present invention provides a method of partially coating a bore cutting tool to selectively coat the rake face.

Preferably, the bore cutting tool is a drill. Preferably the method includes locating a mask over at least part of the drill and applying the coating.

Preferably the coating is applied by PVD. However, any known coating technique in the field of drill coating may be used.

Optional and preferred features of the first aspect also apply to the second aspect.

BRIEF DESCRIPTION OF THE DRAWINGS

Embodiments of the invention and tests and experiments illustrating the principles of the invention will now be described with reference to the accompanying drawings in which:

FIG. 7 shows photographs of the end of a partially coated (left) and fully coated (right) after drilling 240 holes.

DETAILED DESCRIPTION OF EMBODIMENTS OF THE INVENTION AND SUPPORTING EXPERIMENTS

Figure 1:
FIG. 1 shows a fully coated drill of the prior art.

FIG. 1 shows a conventional TiN coated drill and has already been discussed above. All the surfaces of the body of the drill are coated, including the lands and flutes.

Figure 2:
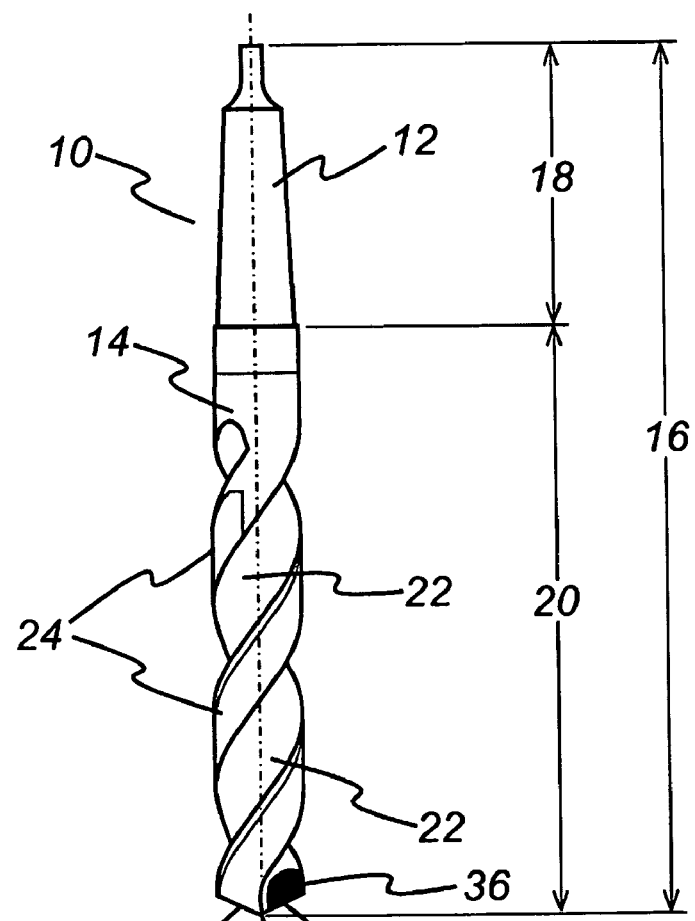
FIG. 2 shows a schematic illustration of a drill.
Figure 3:
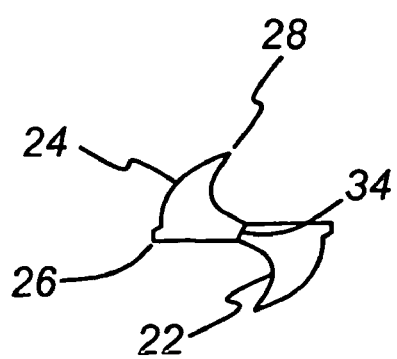
FIG. 3 shows an end-on schematic illustration of the drill of FIG. 2.

FIGS. 2 and 3 shows the features of a typical twist drill. The labelled features, including rake face 36, have already been discussed above.

Figure 4:
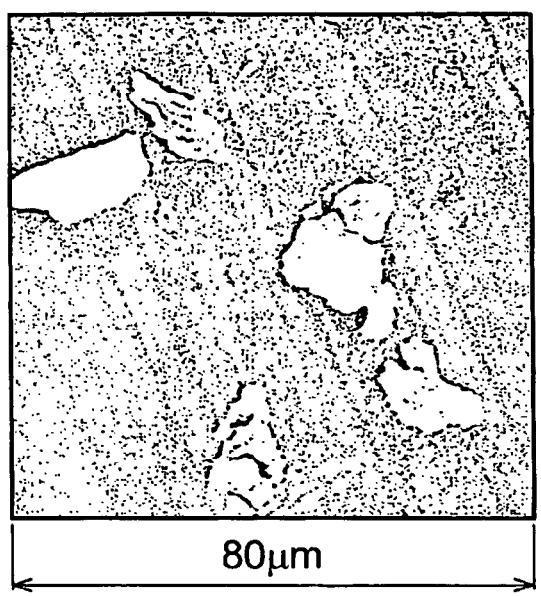
FIG. 4 shows an SEM micrograph of TiN particles.

Similarly, FIG. 4, which shows TiN particles embedded in a Ti alloy work piece, has been discussed above.

Partially Coated Twist Drill

Figure 5:
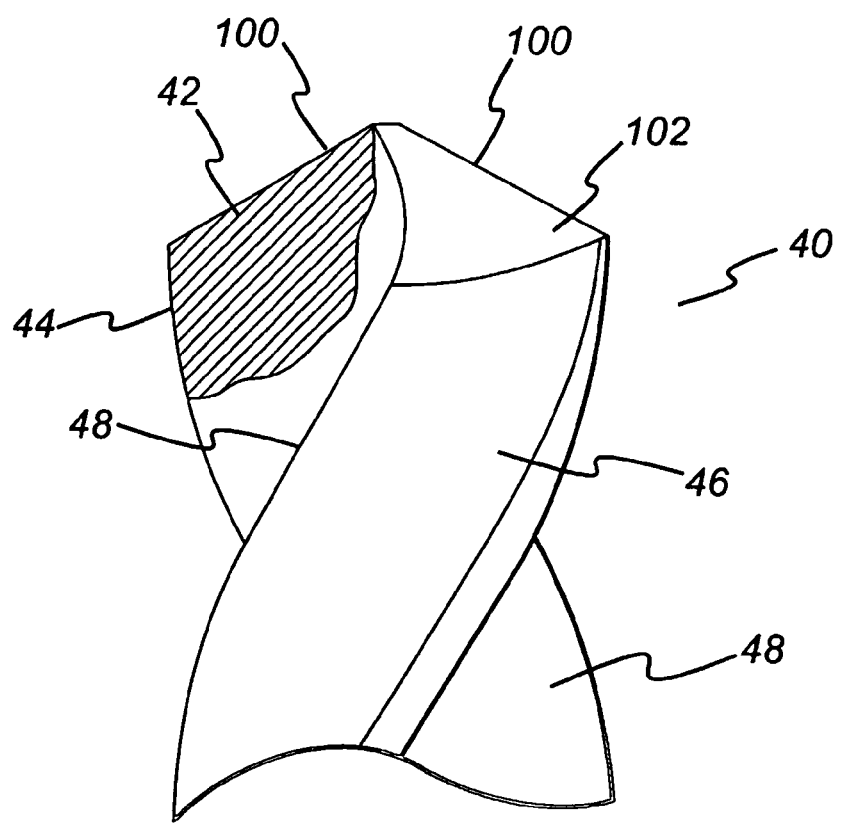
FIG. 5 shows a drill coated on the rake face only.

FIG. 5 shows a drill 40 having cutting edges 100. The drill has a TiN coating 42 on the rake face 44 only. The land 46 (a non-cutting surface as discussed above) and flutes 48 (a non-cutting surface as discussed above) are not coated with TiN.

There are two flutes 48 and hence although not shown, two rake faces. Preferably the second rake face is also at least partially coated.

Back face 102 (also known as a flank) (a non-cutting surface), which extends from the cutting edge, is also not coated.

The TiN coating is preferably 1 to 4 μm thick and was applied using PVD and masking.

The TiN coating was applied using a PVD technique in which an electron beam is used to evaporate deposition material. The evaporated material is deposited on the drill, which is preferably held at about 300° C. to 500° C., more preferably about 480° C.

Drill Life Test

When a hole is drilled, or machined, the contact of the bore cutting tool eg a drill with the work piece (eg titanium), accentuated by high cutting temperatures and pressures, can result in rapid tool wear. This can lead to out-of-round, tapered or smeared holes.

The suitability of a partial coating to resist drill wear was tested.

Drill life is normally measured by the number of holes drilled before the drill becomes dull and the force needed to make a hole increases significantly.

One of the forces that increases is the thrust force and this can be used to measure drill life.

The thrust force $F_z$ (also called the feed force because it is in the feed direction) is the force that acts in the direction of the hole axis and perpendicular to the work piece. The thrust force depends on many factors like the strength of the work piece, feed rate, rotational speed (RPM), cutting fluids, and diameter and geometry of the drill. If the thrust force is too excessive, the drill could break or bend.

As the number of holes drilled increases, the axial force $F_z$ increases proportionally, but only slowly, until the drill becomes worn. When the drill becomes worn, the $F_z$ axial force increases rapidly.

The drill life test measures the increase in $F_z$ axial force (thrust force) over two hundred and forty holes. The increase in axial force can be calculated as follows:

$$\text{Increase in } F_z \text{ axial force} = (F'-F_0)/F_0 * 100 \text{ (percentages)}$$

Where:
$F_0$=Initial force
$F'$=Final force

The thrust force is measured with a dynamometer, which is a block containing a senor for measuring force in the axial direction. The dynamometer is located under the work piece and the drilling machine.

The dynamometer is connected to a charge amplifier, which in turn is connected to an oscilloscope and to a PC, for recording data.

A first hole is drilled in the work piece, which is located on the dynamometer, to measure the thrust force of the new drill. Then, the thrust force is measured again every sixty holes until two hundred and forty holes have been drilled. The thrust force should increase proportionally, as the number of holes increases, if the wear is normal.

A fully coated TiN HSS drill and a partially coated TiN HSS drill having only the rake face coated were tested.

Figure 6:
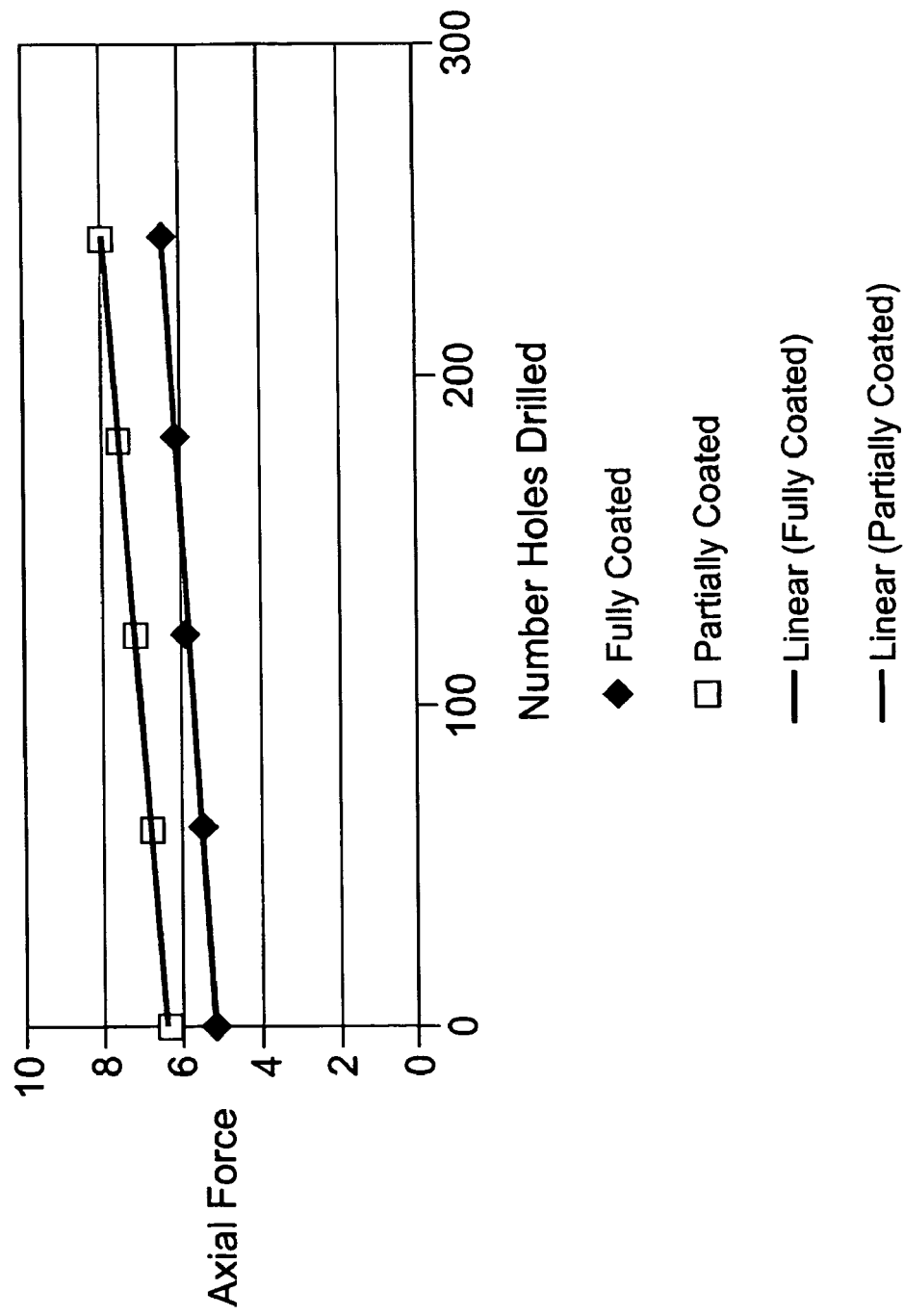
FIG. 6 shows a graph of results from a drill wear test.

The results are illustrated in FIG. 6. Both drills have almost the same increase of thrust force by the time two hundred and forty holes have been made. The increases were 25.1% (fully coated) and 24.9% (partially coated).

The slightly lower absolute axial force of the fully coated drill is probably attributable to the lower level of friction between the drill and workpiece, i.e. all the surfaces in contact with the workpiece have the low friction TiN coating.

Screech Test

The screech test is another method to test the tool-life. This method consists of monitoring the drill wear on the major cutting edge (lip) length. While the number of drilled holes increases, the drill wear increases proportionally, until the cutting edge corner collapses and the drill begins to "screech".

Drill wear is very sensitive to cutting temperature. The temperature at the chip-drill interface is dependent on the specific cutting energy, the cutting speed and feed rate. It is known that hardness of cutting drill decreases as cutting temperature increases. This temperature is largely dependent on the drilling speed, feed rate, the work piece material and coolant.

Under these conditions, severe wear on the margin at the outer edge of the cutting lip is initiated and spread immediately to the lip. Eventually, the drill is unable to continue to cut. The reason why wear is initiated on the margin is that the highest cutting speed occurs at the end of the circumference. Another reason why this drilling condition should be avoided is that when a severe wear on the margin takes place, the drill is unable to continue a steady operation and causes "walking" as well as screeching.

The two pictures shown in FIG. 7, show the "drill-wear" of the fully coated drill and the partially coated drill after two hundred and forty holes were drilled.

The drill-wear was measured every sixty holes, and the results are shown in the table below.

| Number of Holes | Fully TiN Coated Drill | Partially Coated TiN drill |
| --- | --- | --- |
| 60 | 0.025 mm | 0.0305 mm |
| 120 | 0.031 mm | 0.033 mm |
| 180 | 0.0375 mm | 0.0385 mm |
| 240 | 0.0435 mm | 0.044 mm |

The results show that there is hardly any difference between both drills. The only difference was that in the case of the partially coated drill higher wear occurred after sixty holes had been drilled.

These preferred embodiments have been described by way of example and it will be apparent to those skilled in the art that many alterations can be made that are still within the scope of the invention.

The invention claimed is:

1. A bore cutting tool having
   a cutting edge,
   a rake face extending from one side of the cutting edge,
   a non-cutting back face extending from the opposite side of the cutting edge to the rake face, and
   a land,
   wherein the rake face is at least partially coated but the land and at least part of the back face are not coated.

2. A bore cutting tool according to claim 1, wherein all of the back face is not coated.

3. A bore cutting tool according to claim 1, having at least one further non-cutting surfaces, wherein at least part of some or all of the at least one further non-cutting surface is not coated.

4. A method of partially coating a bore cutting tool, the tool having a cutting edge, a rake face extending from one side of the cutting edge, a back face extending from the opposite side of the cutting edge to the rake face and a land, wherein the method includes the step of
   at least partially coating the rake face but not coating the land and at least part of the back face;
   wherein the coating is selected from TiN, TiCN and TiAlN, and the coating thickness is in the range of 0.5 to 50 μm; and
   wherein the tool is made of a material selected from HSS, HSCo, HSCoXP and solid carbide.

5. A bore cutting tool according to claim 1, wherein the rake face is fully coated.

6. A bore cutting tool according to claim 1, wherein only the rake face is coated.

7. A bore cutting tool according to claim 1, wherein the tool has two rake faces.

8. A bore cutting tool according to claim 7, wherein both rake faces are coated.

9. A bore cutting tool according to claim 1, wherein the bore cutting tool is a drill.

10. A bore cutting tool according to claim 9, wherein the bore cutting tool is a twist drill.

11. A bore cutting tool having
    a cutting edge,
    a rake face extending from one side of the cutting edge,
    a back face extending from the opposite side of the cutting edge to the rake face and
    a land,
    wherein the rake face is at least partially coated but the land and at least part of the back face are not coated;
    wherein the coating is selected from TiN, TiCN and TiAlN, and the coating thickness is in the range of 0.5 to 50 μm; and
    wherein the tool is made of a material selected from HSS, HSCo, HSCoXP and solid carbide.

12. A twist drill according to claim 10, including at least one flute, and wherein at least part of the flute is uncoated.

13. A twist drill according to claim 1, having a number of flutes selected from 2, 3 and 4 flutes.

14. A bore cutting tool according to claim 1, wherein the coating is a wear resistant coating.

15. A bore cutting tool according to claim 14, wherein the coating is selected from TiN, TiCN, TiAlN and AlTiN.

16. A bore cutting tool according to claim 1, wherein the tool is made of a material selected from HSS, HSCo, HSCoXP and solid carbide.

17. A bore cutting tool according to claim 1, wherein the coating thickness is in the range of 0.5 to 50 μm.

18. A bore cutting tool according to claim 15, wherein the coating thickness is in the range of 2 to 10 μm.

19. A bore cutting tool according to claim 1, wherein the coating is applied by physical vapour deposition.

20. A bore cutting tool according to claim 1, wherein the coating is applied by using a mask to prevent coating of the uncoated parts.

21. A method of partially coating a bore cutting tool, the tool having a cutting edge, a rake face extending from one side of the cutting edge, a non-cutting back face extending from the opposite side of the cutting edge to the rake face, and a land, wherein the method includes the step of
    at least partially coating the rake face but not coating the land and at least part of the back face.

22. A method according to claim 21, wherein the back face is not coated.

23. A method according to claim 21, including the steps of masking those areas that are to remain uncoated but leaving the rake face exposed, and coating the masked bore cutting tool.

24. A method according to claim 23, wherein the bore cutting tool has at least one further non-cutting surface and at least part of some or all of the at least one further non-cutting surface is masked.

25. A method according to claim 21, wherein the bore cutting tool is a drill.

26. A method according to claim 21, wherein the coating is applied by physical vapour deposition.

* * * * *